(12) United States Patent
Yamanishi et al.

(10) Patent No.: US 6,399,439 B1
(45) Date of Patent: Jun. 4, 2002

(54) METHOD FOR MANUFACTURING SEMICONDUCTOR DEVICE

(75) Inventors: Nobuyuki Yamanishi; Toshiyuki Hirota, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/252,885

(22) Filed: Feb. 18, 1999

(30) Foreign Application Priority Data

Feb. 19, 1998 (JP) ............................................. 10-037123

(51) Int. Cl.⁷ .......................................... H01L 21/8242
(52) U.S. Cl. ......................... 438/255; 438/253; 438/398
(58) Field of Search ............................... 438/253, 254, 438/255, 396, 397, 398, 964

(56) References Cited

U.S. PATENT DOCUMENTS 5,278,091 A   1/1994   Fazan et al.
5,418,180 A   5/1995   Brown
6,027,970 A * 2/2000   Sharan et al. ................ 438/255

FOREIGN PATENT DOCUMENTS

| JP | 7-7000 | 1/1995 |
| JP | 7-335842 | 12/1995 |
| JP | 9-181276 | 7/1997 |
| JP | 9-312379 | 12/1997 |
| WO | WO 99/04434 | 1/1999 |

* cited by examiner

Primary Examiner—Charles Bowers
Assistant Examiner—Jack Chen
(74) Attorney, Agent, or Firm—McGinn & Gibb, PLLC

(57) ABSTRACT

Disclosed herein is a method for manufacturing a semiconductor device in which a hemispherical grain size of an inner and an outer wall surfaces of a cylindrical member is uniform to promote the increase of surface areas and to prevent short-circuit between the adjacent cylindrical members. This is achieved (i) by removing an amorphous silicon originally grown layer or (ii) by suppressing the function of the originally grown layer.

6 Claims, 6 Drawing Sheets

METHOD FOR MANUFACTURING SEMICONDUCTOR DEVICE

BACKGROUND OF THE INVENTION (a) Field of the Invention

The present invention relates to a method for manufacturing a semiconductor device of a stacked capacitor type memory cell having on a substrate a cylindrical member having a bottom and no top made of polysilicon, and more in particular to the method for manufacturing the semiconductor device having the stacked capacitor type memory cell equipped with a capacitor having a. large electrostatic capacity per occupied unit area.

(b) Description of the Related Art

Recently, in a semiconductor memory device such as DRAM (Dynamic Random Access Memory), a demand of decreasing a required area of each memory cell for attaining high integration is highly desired. In order to respond to this demand, it is important to form a capacitor having a large electrostatic capacity per occupied unit area in each of the memory cells.

The increase of the electrostatic capacity, of either of an upper electrode or a lower electrode of each of the capacitors, for example of the lower electrode, is attempted by employing a cylindrical electrode as the lower electrode. Moreover, the surface area of the electrode is increased by forming a layer of hemispherical silicon nuclei (HSG-Si: Hemi-Spherical Grained Si) on the cylindrical electrode surface to make the electrode surface uneven so as to further increase the electrostatic capacity.

First, a method for forming a conventional cylindrical lower electrode having the hemispherical silicon grains applied for making a stacked capacitor type memory cell will be described with reference to FIGS. 1 to 6. FIGS. 1 to 6 are sectional views suquentially showing the respective layered structures including a substrate of each of the steps for conducting the above method.

(1) In a conventional method, an element separation film 14 is formed on a silicon substrate 12, and a gate oxide film is formed in a region after the element separation as shown in FIG. 1. Then, the formation of gate electrodes 16A, 16B followed by that of source/drain diffusion regions 18 makes two adjacent n-MOSFETs.

Then, an interlayer insulation film 20 made of -a BPSG film and a first silicon oxide film 22 are successively formed on the whole substrate 12 surface.

Through holes for exposing the source regions 18 are perforated through the first silicon oxide film 22 and the interlayer insulation film 20, and the through holes are filled with phosphorus (P) doped amorphous silicon film (hereinafter referred to as "P-doped Si film") to make capacitance contact plugs 24 which are electrically connected with the source regions 18.

A silicon nitride film 26, a spacer layer 28 made of a BPSG film and a second silicon oxide film 30 are successively layered on the whole substrate surface. The patterning by means of photolithography is conducted to etch the second silicon oxide film 30, the spacer layer 28 and the silicon nitride film 26 to form openings (concaves) 32 for making lower electrodes. The layered structure shown in FIG. 1 is obtained.

(2) Then, a P-doped Si film between 1000 and 1500 Å is grown along the whole open walls of the openings 32 under the below conditions for growing an intermediate. layer 34 for forming the cylindrical lower electrode (hereinafter referred to as "cylindrical member 34") as shown in FIG. 2. In FIG. 2, a numeral 36 designates an outer part of the P-doped Si film, or a phosphorous doped amorphous silicon originally grown layer (hereinafter referred to as "originally grown layer") in contact with the opening wall of the openings 32.

Conditions for Growing P-Doped Si Film

Reaction Gas: $SiH_4+PH_3$

Temperature for Growing: 525 to 535° C.

Pressure: 1.5 to 2.0 torr.

(3) Silica glass is then spin-coated on the whole substrate surface to form a silica film (SOG) which is etched back to obtain a layered structure having a silica layer 38 on the cylindrical member 34 as shown in FIG. 3. The silica layer 38 is employed for protecting the bottom part 35 of the cylindrical member 34 from being etched when the P-doped Si film is etched. A resist film or the like can be used in place of the silica film 38 as long as it functions as a protection film.

(4) The silica film 38 is then etched employing the second silicon. oxide film 30 as an etching stopper as shown in FIG. 4.

(5) The second silicon oxide film 30 and the spacer layer 28 are then etched employing the silicon nitride film 26 as an etching stopper to expose the outer and inner wall surfaces of the cylindrical member 34 made of the phosphorous doped amorphous silicon (lower electrode intermediate) as shown in FIG. 5.

(6) The silicon nitride film 26 employed as the etching stopper is then removed by the etching without etching the cylindrical member 34 to expose the first silicon oxide film 22 as shown in FIG. 6.

(7) After the above procedures are completed, the cylindrical member 34 is subjected to a treatment for making hemispherical silicon grains employing a reaction furnace preferably in a batchwise operation as follows. The above treatment of the cylindrical member 34 may be performed successively in a sheetwise operation.

(i) A wafer having the above layered structure is sent to the reaction furnace, and a temperature is elevated under high vacuum to 560° C. and maintained for 30 minutes. This step is called a temperature stabilization step.

(ii) An $SiH_4$ gas is introduced into the reaction furnace at a rate of 75 sccm while maintaining the temperature of 560° C. and the wafer is irradiated with the above gas for 20 minutes. Si crystal nuclei are thereby formed on the P-doped Si film 34. This step is called an $SiH_4$ irradiation step.

(iii) The wafer is then subjected to an annealing treatment under high vacuum maintaining the temperature of 560° C. The Si crystal nuclei are thereby grown to become the hemispherical grains by means of integrating the silicon atoms in the P-doped Si film on the Si crystal nuclei formed on the P-doped Si film. This step is called an annealing step. During the treatment of making the hemispherical grains, the P-doped Si film is converted into a phosphorous doped polysilicon film by means of the annealing treatment.

After the above procedures, the surface of the cylindrical member 34 has been formed by the hemispherical grains.

In the above treatment, however, among the hemispherical silicon grains formed on the surface of the cylindrical member 34, those on the outer wall surface have non-hemispherical grain surfaces 42 and uneven shapes though those on the inner wall surface have hemispherical grain surfaces 40 of a uniform and preferable grain radius as shown in FIG. 7. Moreover, the grain size of the former becomes excessively large so that the respective grains are in contact with one another not to increase the surface area of the cylindrical member to an expected value.

With the miniaturization of memory cells, a cell pitch between the memory cells becomes extremely small, and an interval between two adjacent cylindrical lower electrodes becomes short accordingly. For example, in the direction of a shorter side of the lower electrode, a width of the cylindrical member is 0.25 to 0.40 micronmeter while an interval between the electrodes is 0.15 to 0.18 micronmeter. On the other hand, in direction of a longer side of the lower electrode, a width of the cylindrical member is 0.70 to 0.78 micronmeter while an interval between the electrodes is 0.20 to 0.23 micronmeter. These intervals are extremely short. When, therefore, the grain size 42 becomes excessively large, the outer walls of the adjacent cylindrical members are likely to be in contact with each other via the grains to produce a short-circuit between the adjacent electrodes.

These defects may reduce the effectiveness of producing the hemispherical grains on the surface of the cylindrical member, and the realization of the memory cell having a large electrostatic capacity is difficult, and the memory cell having a high electrical reliability and no fear of short-circuit can be hardly provided, or the yield of the memory cells is lowered.

SUMMARY OF THE INVENTION

It is, therefore, an object of the present invention to provide a method for manufacturing a semiconductor device having a highly reliable stacked capacitor type memory cell equipped with a capacitor having a large electrostatic capacity per occupied unit area and no fear of generating short-circuit or the like.

The present invention provides a method for manufacturing a semiconductor device having a substrate and a cylindrical member formed thereon comprising, a step of forming a spacer layer made of etchable material on the substrate, a step of making a concave in the spacer layer, a step of making an amorphous silicon film along the concave to form an amorphous silicon cylindrical member having the amorphous silicon film as a cylindrical wall thereof, an exposure step of etching the spacer layer to expose the inner and outer wall surfaces of the amorphous silicon cylindrical member, a removal step of removing the outer wall surface layer of the amorphous silicon cylindrical member by mean of etching, a step of treating the outer and inner wall surfaces of the amorphous silicon cylindrical member to form hemispherical silicon grains thereon to convert the amorphous silicon cylindrical member into a polysilicon cylindrical member of which outer and inner wall surfaces have the hemispherical silicon grains.

The present invention also provides a method for manufacturing a semiconductor device having- a substrate and a cylindrical member formed thereon comprising, a step of forming a spacer layer made of etchable material on said substrate, a step of making a concave in said spacer layer, a step of making an amorphous silicon film along said concave to form an amorphous silicon cylindrical member having said amorphous silicon film as a cylindrical wall thereof, an exposure step of etching said spacer layer to expose the inner and outer wall surfaces of said amorphous silicon cylindrical member, a step of treating the outer and inner wall surfaces of the amorphous silicon cylindrical member to form hemispherical silicon grains thereon to convert the said amorphous silicon cylindrical member into a polysilicon cylindrical member of which outer and inner wall surfaces have the hemispherical silicon grains, and said treatment step further comprising, a first step of elevating a temperature of the amorphous silicon cylindrical member to a prescribed temperature while flowing a hydrogen gas and/or a phosphin gas into a reaction furnace accommodating the substrate having said amorphous silicon cylindrical member and maintaining the cylindrical member at the prescribed temperature for a first prescribed period of time, a second step of introducing an $SiH_4$ gas into the reaction furnace and irradiating said cylindrical member with said $SiH_4$ gas for a second prescribed period of time while maintaining said cylindrical member at the prescribed temperature, and a third step of maintaining said cylindrical member at the prescribed temperature under vacuum and of thermally treating said cylindrical member to convert said member into said polysilicon cylindrical member.

The present invention further provides a method for manufacturing a semiconductor device having a substrate and a cylindrical member formed thereon comprising, a step of forming a spacer layer made of etchable material on said substrate, a step of making a concave through said spacer layer, a cylindrical member formation step of making an amorphous silicon film along said concave to form an amorphous silicon cylindrical member having said amorphous silicon film as a cylindrical wall thereof, an exposure step of etching said spacer layer to expose the inner and outer wall surfaces of said amorphous silicon cylindrical member, a step of treating the outer and inner wall surfaces of the amorphous silicon cylindrical member to form hemispherical silicon grains thereon to convert the said amorphous silicon cylindrical member into a polysilicon cylindrical member of which outer and inner wall surfaces have the hemispherical silicon grains, and said cylindrical member formation step further comprising, a first step of forming a first amorphous silicon film having a thickness between 50 and 80 Å along the wall of said concave under a temperature between 490 and 510° C. and a pressure between 0.3 and 1.0 torr. while introducing an $SiH_4$ gas and a phosphine gas into a reaction furnace accommodating the substrate having the concave in the spacer layer, and a second step of forming a second amorphous silicon film on the first amorphous silicon film while maintaining conditions of a temperature between 525 and 535° C. and of a pressure between 1.5 and 2.0 torr. after elevating the temperature at a rate of 2 to 5° C./min. and the pressure at a rate of 0.1 to 0.3 torr./min.

In accordance with each of the methods of the present invention, the amorphous silicon cylindrical member having on the inner and outer wall surfaces the hemispherical grains having a uniform grain size can be obtained by (1) removing in advance the originally grown layer before forming the hemispherical grains, by (2) growing the amorphous silicon film under the conditions of suppressing the growth of the amorphous silicon film, or by (3) controlling the growth of the hemispherical grains on the originally grown layer in the temperature stabilization step.

The semiconductor device equipped with a capacitor having a remarkably increased surface area per unit electrode surface, a large electrostatic capacity and no connection deficiency such as short-circuit can be obtained by applying the method of the present invention to the manufacture of the above semiconductor device.

PREFERRED EMBODIMENTS OF THE INVENTION

The present inventors have investigated the reasons why grains grown in accordance with a conventional method do not become the hemispherical grains on an outer wall surface of a cylindrical member and have irregular shapes, and the grain size becomes excessively large so that the respective grains are in contact with one another. As a result, we have found out the followings.

Figure 2:
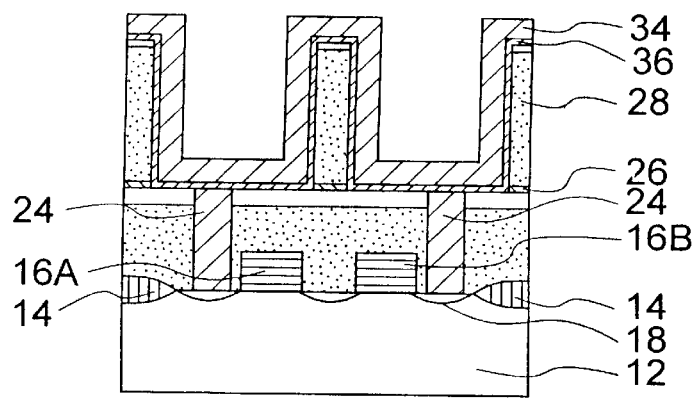
Figure 3:
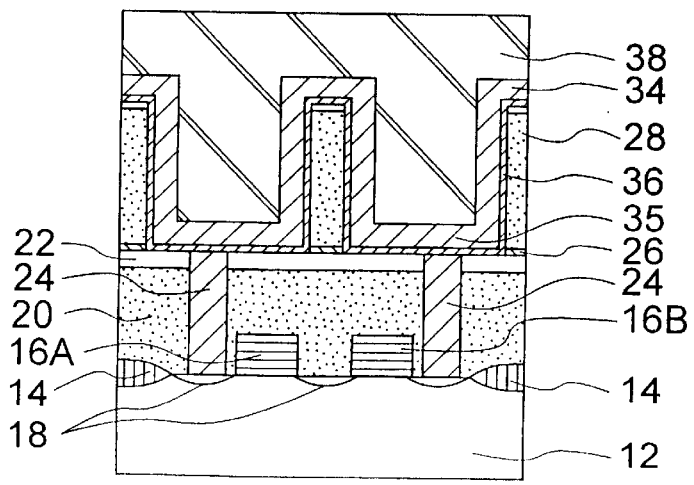
Figure 4:
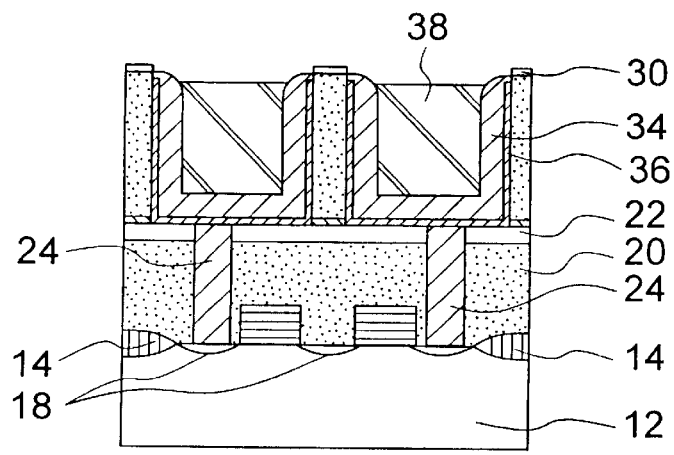

(1) An originally grown layer 36 (refer to FIG. 2) having a thickness of about 50 to 80 Å grows for about 3 to 5 minutes after the initiation of the growth of a P-doped Si film when the P-doped Si film is grown for forming a cylindrical member.

It has been recognized that this originally grown layer 36 is as a whole an amorphous silicon film, but that crystal nuclei grow at the interface between the opening wall of the opening 32 and the originally grown layer 36. The silicon crystal nuclei are exposed to the outer wall surface of the cylindrical member when the cylindrical member is exposed for the treatment of growing the hemispherical grains. As a result, the silicon crystal nuclei begin to grow prematurely during the temperature stabilization step in the above treatment, and more and more grow in the $SiH_4$ irradiation step. It has been affirmed that the abnormally grown grains are formed on the outer wall surface of the cylindrical member 34. On the other hand, the grains on the inner wall surface are normally grown to form an excellent surface having the hemispherical grains because no silicon crystal nuclei are formed thereon during the early stage of temperature stabilization.

(2) The silicon crystal nuclei are likely to be formed in the P-doped Si film forming step when the growth temperature is high and a partial pressure of the gas $SiH_4$ is small. Accordingly, it is conceivable that the generation of the silicon crystal nuclei on originally grown layer 36 would be suppressed by employing a gas component which can grow the P-doped Si film at a low temperature such as disilane ($Si_2H_6$) which can grow the P-doped Si film at about 510° C. However, the We of the disilane for growing the hemispherical grains is considerably smaller than that of $SiH_4$. Therefore, because of its low productivity, the practical use of the disilane is difficult.

The necessity of further investigating the conditions of growing the P-doped Si film employing the $SiH_4$ gas was thus recognized.

For this purpose, the present inventors have conducted a series of experiments for actually suppressing the above-mentioned disadvantages and reached the present invention.

In the present invention, the etchable material means material that is removed by dry etching or wet etching, and would include materials such as a BPSG film, an SOG film, a TEOS film or the like. The sectional shape of the cylindrical member is discretionary, and for example, a cylindrical member having a circular or elliptical section and that having a square or rectangular section may be used.

Now, the present invention will be more specifically described with reference to accompanying drawings. Description of similar elements to those of FIGS. 1 to 7 is omitted by affixing the same numerals thereto.

Embodiment 1

Figure 8:
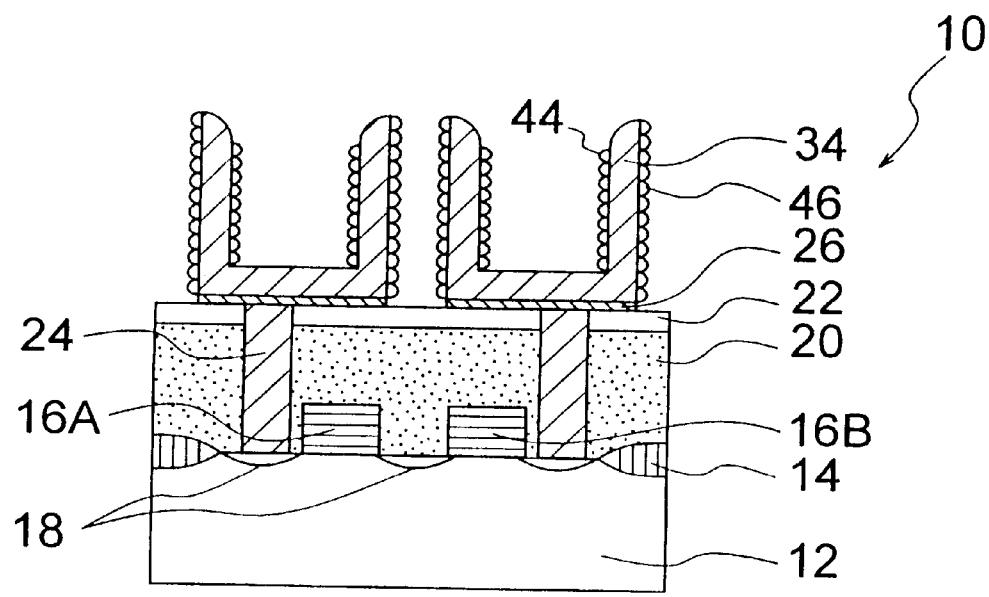
FIG. 8 is a sectional view showing a lower electrode having improved hemispherical grains 44,46 in Embodiment 1.

The present Embodiment is an example of the memory cell of the semiconductor device having stacked capacitor type memory cells obtained by applying the first method of the present invention. FIG. 8 is a sectional view showing a lower electrode having hemispherical grains. Embodiments 2 through 7 discussed below teach alternative methods of achieving the result shown as Embodiment 1 in FIG. 8.

As shown in in FIG. 8, main portion of a stacked capacitor type memory cell 10 equipped in the semiconductor device of the present Embodiment includes, on a silicon substrate 12, two n-MOSFETs adjacent to each other and cylindrical lower electrodes 34 made of phosphorous doped polysilicon stacked on the MOSFETs via an interlayer insulation film 20.

The two n-MOSFETs have gate electrodes 16A,16B and source/drain regions 18 on the silicon substrate 12 region separated by an element separation film 14, and are adjacent to each other commonly owning one drain (source) region.

The lower electrode 34 is electrically connected with the source (drain) region 18 by a capacity contact plug 24 penetrating through the interlayer insulation film 20 made of a BPSG film and a first silicon oxide film 22.

In the memory cell 10 of the present Embodiment, the inner and the outer walls 44,46 of the lower electrode 34 have surfaces made of hemispherical grains having a similar grain size uniformly dispersed at a similar grain distribution thereby remarkably increasing a surface area per electrode unite area to form a capacitor of a large electrostatic capacity.

No short-circuit between the two lower electrodes is generated by the contact among the grains different from the conventional device in which the abnormal grain formation occurs on the outer wall surface.

Embodiment 2

Figure 9:
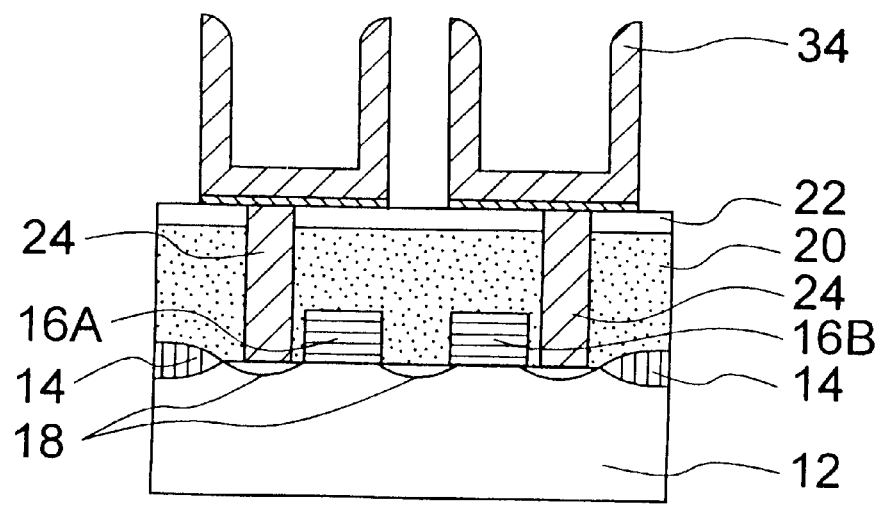
FIG. 9 is a sectional view showing a cylindrical member 34 before the treatment of making hemispherical grains in Embodiments 2, 3 and 4.

The present Embodiment is an example of applying the first method of the present invention to the formation of the cylindrical lower electrodes of the stacked capacitor type memory cells. FIG. 9 is a sectional view showing a cylindrical member before the treatment. This structure results from the conventional method shown in FIGS. 1–6, as follows.

Figure 5:
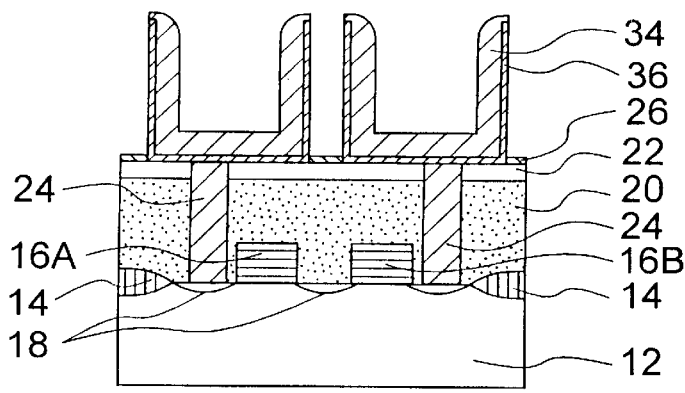

(1) In the method of manufacture of the present Embodiment, the substrate having the layered structure shown in FIG. 5 including the cylindrical member 34 made of the phosphorous doped amorphous silicon on the silicon nitride film 26 is formed similarly to a conventional method. The cylindrical member 34 has an originally grown layer 36 on the outer wall surface.

Figure 6:
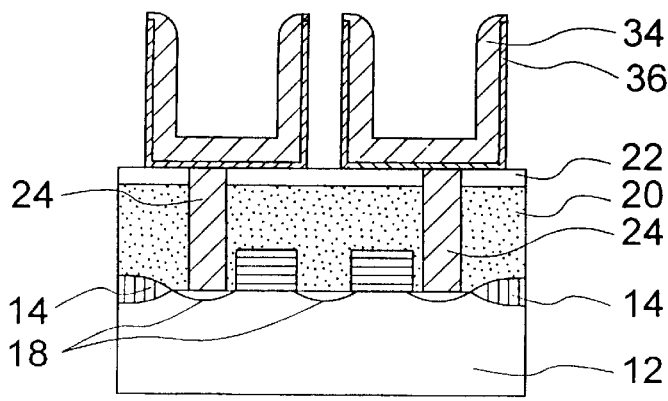
Figure 7:
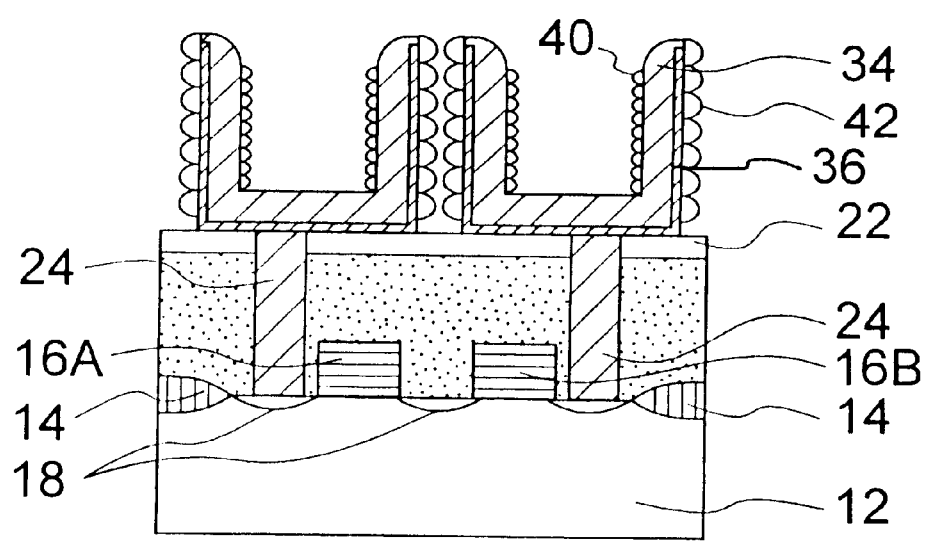
FIG. 7 is a sectional view showing a disadvantage on an outer wall surface of a cylindrical member manufactured in accordance with a conventional process.

(2) The silicon oxide layer 22 is exposed as shown in FIG. 6 by dry-etching the silicon nitride layer 26 employing a plasma etching apparatus under the following etching conditions. Under the conditions, the etching rates of the silicon nitride film, the P-doped Si film and the silicon oxide film are 1800 to 1900 Å/min., 580 to 600 Å/min. and 700 to 800 Å/min., respectively.

Etching Conditions

Etching Gas: CHF3(40 to 55 sccm)/O2(5 to 20 sccm)

Pressure: About 37 mTorr.

Temperature: 40 to 70° C.

Output: 300 W (3) The originally grown layer 36 is then removed by the isotropic light etching as shown in FIG. 9 under similar conditions except that the RF output is 150 to 200 W to form an outer wall having no originally grown layer 36 similar to the inner wall. In the light etching, only the RF output is different from that employed in the above etching operation, and the other conditions such as a gas component, a gas flow rate, a pressure or the like are the same.

(4) The inner and outer wall surfaces of the cylindrical member 34 are treated under similar conditions to those of a conventional method to form the hemispherical grains. According to this treatment, the hemispherical grains having a uniform grain size are grown on the inner and outer wall surfaces as shown in FIG. 8. During the treatment of making the hemispherical grains, the P-doped Si film is converted into a phosphorous doped polysilicon film by means of the annealing treatment. This conversion also occurs in the following Embodiments.

Embodiment 3

The present Embodiment is another example of applying the first method of the present invention to the formation of the cylindrical lower electrodes.

(1) In the method of the present Embodiment, the cylindrical member 34 is formed similarly to Embodiment 2. The cylindrical member 34 has the originally grown layer 36 on the outer wall surface.

(2) The silicon oxide layer 22 is exposed as shown in FIG. 6 by dry-etching the silicon nitride layer 26 employing a plasma etching apparatus under similar etching conditions as those of Embodiment 2.

(3) The originally grown layer 36 is then removed by the isotropic light etching as shown in FIG. 9 under the following conditions employing the same plasma etching apparatus and changing a gas component to form an outer wall having no originally grown layer 36 similar to the inner wall. Under the conditions, the etching rates of the silicon oxide film and the P-doped Si film are about 280 Å/min. and about 240 Å/min., respectively.

Etching Conditions

Etching Gas: CF4(30 to 50 sccm)

Pressure: 37 to 148 mTorr.

Temperature: Ordinary Temperature

RF Output: 70 to 100 W (4) The inner and outer wall surfaces of the cylindrical member 34 are treated under similar conditions to those of a conventional method to form hemispherical grains. According to this treatment, the hemispherical grains having a uniform grain size are grown on the inner and outer wall surfaces as shown in FIG. 8.

This Embodiment has an advantage of capable of successively etching the silicon nitride film and the amorphous silicon cylindrical film on the spacer side by employing the same etching apparatus.

Embodiment 4

The present Embodiment is a further example of applying the first method of the present invention to the formation of the cylindrical lower electrodes.

(1) In the method of the present Embodiment, the cylindrical member 34 is formed similarly to Embodiment 2 as shown in FIG. 5. The cylindrical member 34 has the originally grown layer 36 on the outer wall surface.

(2) The silicon oxide layer 22 is exposed as shown in FIG. 6 by dry-etching the silicon nitride layer 26 employing a plasma etching apparatus under similar etching conditions to those of Embodiment 2.

(3) The originally grown layer 36 having a thickness of 50 to 80 Å is then removed by the wet etching under the following conditions to form an outer wall having no originally grown layer 36 as shown in FIG. 9 similar to the inner wall. Under the conditions, the P-doped Si film having a thickness of about 57 to 80 Å is etched at an etching rate of about 3.8 Å/min. On the other hand, the first silicon oxide film 22 having a thickness of about 70 to 100 Å is etched at an etching rate of about 4.8 Å/min. which is negligible because the first silicon oxide film 22 is thick.

The treatment of the wet etching is easily controlled and such a damage as a charging-up which may simultaneously occur with the dry-etching is not produced in the substrate.

Etching Conditions

Etchant: Mixed Solution (NH3:H2O2:H2O=1:1:5)

Temperature: 60 to 70° C.

Time: 15 to 20 Minutes (4) The inner and outer wall surfaces of the cylindrical member 34 are treated under similar conditions to those a conventional method to form hemispherical grains. According to this treatment, the hemispherical grains having a uniform grain size are grown on the inner and outer wall surfaces as shown in FIG. 8.

Embodiment 5

The present Embodiment is an example of applying the second method of the present invention to the formation of the cylindrical lower electrodes of the stacked capacitor type memory cell.

(1) In the method of the present Embodiment, the cylindrical member 34 is formed similarly to a conventional method as shown in FIG. 6. The cylindrical member 34 has the originally grown layer 36 on the outer wall surface.

(2) A procedure of forming hemispherical grains is then started.

(i) In the temperature stabilization step, a temperature of a cylindrical member 34 is elevated to 560° C. while a hydrogen (H$_2$) gas or a phosphin (PH$_3$) gas is flown at a rate of 50 to 100 sccm into a reaction furnace accommodating the substrate having the cylindrical member 34, and this temperature is maintained for 30 minutes.

(ii) In the SiH$_4$ irradiation step, after the introduction of the hydrogen gas or the phisphin gas is stopped, an SiH$_4$ gas is introduced into the reaction furnace at a flow rate of 75 sccm and irradiated to the cylindrical member 34 for 20 minutes while the temperature of the cylindrical member is maintained at 560° C.

(iii) The cylindrical member 34 is subjected to the annealing treatment at 560° C. under high vacuum in the reaction furnace.

After the above procedures, the hemispherical grains having a uniform grain size have grown on the inner and outer wall surfaces of the cylindrical member 34 as shown in FIG. 8.

The surface of the amorphous silicon film on the cylindrical member is converted into the hemispherical grains by eliminating hydrogen molecules on the surface of the amorphous silicon film. Therefore, the formation of the hemispherical grains on the originally grown layer in the temperature stabilization step can be suppressed by restraining the elimination of the hydrogen molecules. In the present Embodiment, accordingly, the hydrogen molecule elimination is suppressed by introducing the hydrogen gas or the phosphine gas and elevating the reaction furnace temperature in place of the conventional temperature stabilization under high vacuum. The press re of the hydrogen or phosphine gas is in the range of 0.1 to 10 Torr.

Embodiment 6

The present Embodiment is another example of applying the second method of the present invention to the formation of the cylindrical lower electrodes of the stacked capacitor type memory cell. In this Embodiment, the cylindrical member is maintained at a first prescribed temperature for a first period of time in which the originally grown layer is not grown to produce hemispherical grains and then the cylindrical member is maintained at a second prescribed temperature while it is irradiated with an SiH$_4$ gas for a second prescribed period of time and is finally thermally treated to be converted into a polysilicon cylindrical member at the second prescribed temperature for a third prescribed period of Ordinarily, the first prescribed temperature is between 450 and 500° C., the first period of time is about 30 minutes, the second prescribed temperature is about 560° C., the second prescribed period of time is about 20 minutes, and the third prescribed period of time is about 40 minutes.

(1) In the method of the present Embodiment, the cylindrical member 34 is formed similarly to Embodiment 5 as shown in FIG. 6. The cylindrical member 34 has the originally grown layer 36 on the outer wall surface.

(2) A procedure of forming hemispherical grains is then started.

(i) At first, the temperature of the cylindrical member 34 is elevated to 500° C. while the reaction furnace accommodating the substrate having the cylindrical member 34 is kept under vacuum, and the cylindrical member is maintained at 500° C. for 30 minutes.

(ii) The temperature of the cylindrical member is then elevated from 500° C. to 560° C. at a rate of 10 to 15° C./min. The SiH$_4$ gas is introduced into the reaction furnace at a flow rate of 75 sccm and irradiated to the cylindrical member 34 for 20 minutes while the temperature of the cylindrical member is maintained at 560° C.

(iii) The cylindrical member 34 is subjected to the annealing treatment at 560° C. for 40 minutes under high vacuum in the reaction furnace.

After the above procedures, the hemispherical grains having a uniform grain size have grown on the inner and outer wall surfaces of the cylindrical member 34 as shown in FIG. 8.

Embodiment 7

Figure 10:
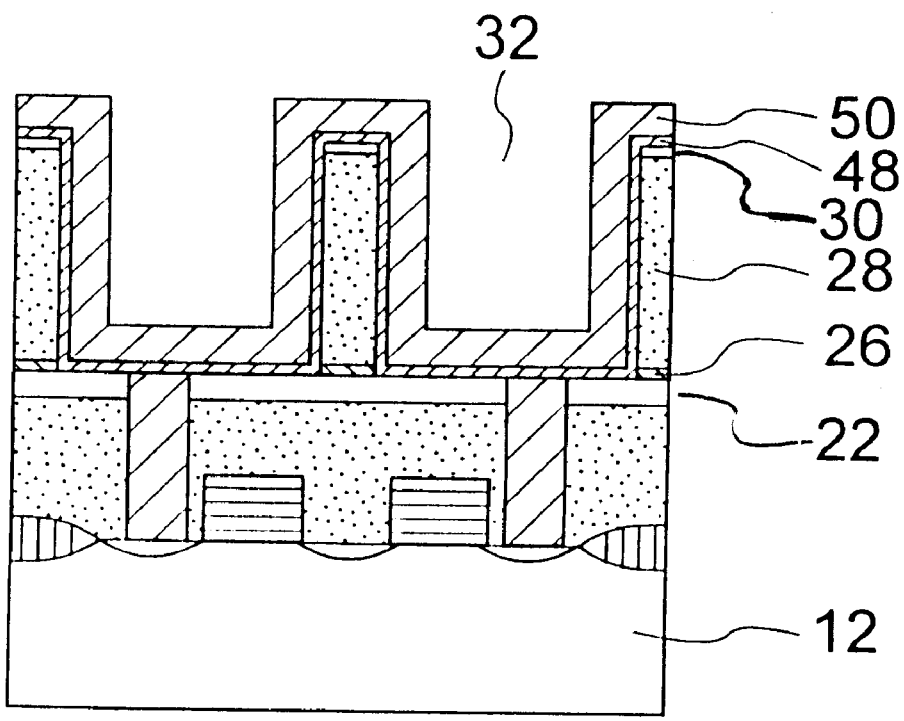
FIG. 10 is a sectional view showing a layered structure at a stage when the formation of a P-doped Si film is completed in Embodiment 7.

The present Embodiment is an example of applying the third method off the present invention to the formation of the cylindrical lower electrodes of the stacked capacitor type memory cell. FIG. 10 is a sectional view of the substrate having a layered structure at a stage when the formation of a P-doped Si film is completed in this Embodiment.

In this Embodiment, the conversion of the originally grown layer can be suppressed by specifying the conditions of the temperature stabilization step and the SiH$_4$ irradiation step.

Figure 1:
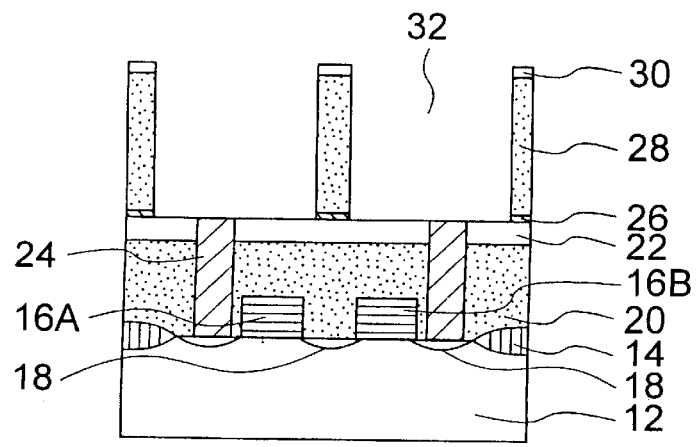
FIGS. 1 to 6 are sectional views consecutively showing the respective steps of manufacturing a conventional layered structure.

(1) In the method of the present Embodiment, the substrate having a layered structure including the silicon nitride film 26, the spacer layer 28 and the second silicon oxide film 30 with the opening (concave) 32 perforated through the three elements is formed as shown in FIG. 1 similarly to a conventional method.

(2) The substrate is then irradiated with the SiH$_4$ gas at a temperature between 490 and 510° C. and a pressure between 0.3 and 1.0 Torr. to form a first P-doped Si film 48 having a thickness between 20 and 50 Å along the wall of the opening 32 as shown in FIG. 10.

After the irradiation of the SiH$_4$ gas is stopped, a second P-doped Si film 50 is formed on the first P-doped Si film 48 as shown in FIG. 10 by elevating the temperature and the pressure to a temperature range between 525 and 535° C. and to a pressure range between 1.5 and 2.0 Torr. at a rate between 2 and 5° C./min. and a rate between 0.1 and 0.3 Torr./min., respectively, and then the second irradiation of the SiH$_4$ gas to the substrate was conducted while the above temperature and pressure are maintained.

(3) Using conventional steps shown in FIGS. 3–6, the silica layer 38 (reference FIG. 3), is then formed and etched to expose the cylindrical member formed by layers 48,50 (equivalent to layer 34 in FIGS. 3–6), and the silicon nitride film 26 is removed by the etching to expose the first silicon oxide film 22.

(4) The cylindrical member formed by layers 48,40 (equivalent to layer 34 in FIGS. 3–6) is then subjected to the treatment to form the hemispherical grains similarly to a conventional method.

After the above procedures, the hemispherical grains having a uniform grain size result on the inner and outer wall surfaces of the cylindrical member 34 as shown in FIG. 8.

In the final embodiment, the growth of the silicon nuclei at the interface between the first amorphous silicon film and the spacer layer has been suppressed by making the temperature and pressure of the conditions for growing the first amorphous silicon film lower than those of normal conditions during the manufacture of the amorphous silicon film in the present Embodiment.

Figure 11:
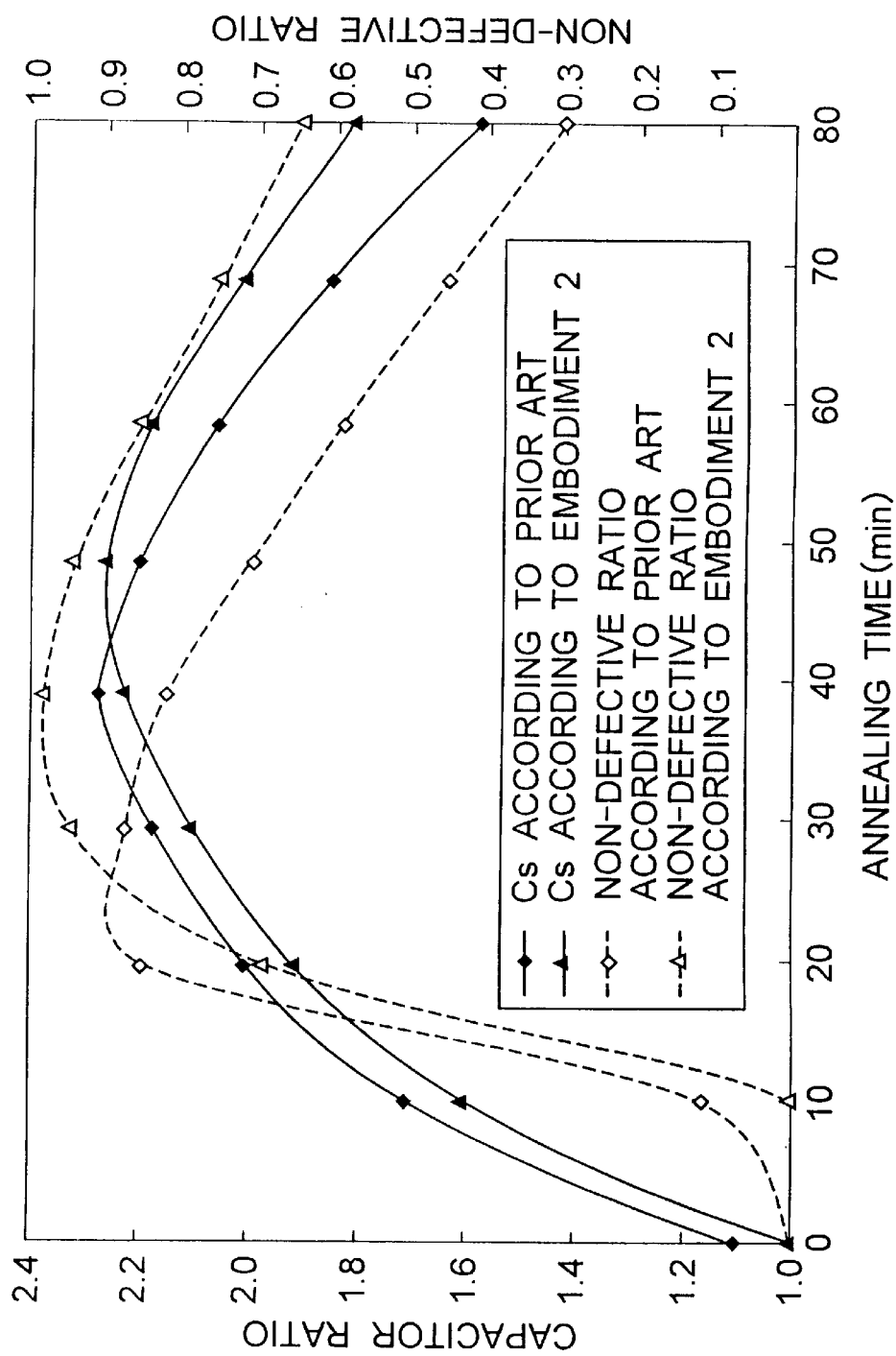
FIG. 11 is a graph showing a relation between an annealing time and a capacitor ratio and a relation between the annealing time and a non-defective ratio of capacitors obtained by a method of Embodiment 2 and by a conventional method.

FIG. 11 is a graph showing a relation between an annealing time and a capacitor ratio and a relation between the annealing time and a non-defective ratio of the capacitors obtained by the method of Embodiment 2 and by the conventional method. The capacitor ratio means the ratio of an electrostatic capacity of a capacitor treated to have hemispherical grains when that of another capacitor not treated is regarded to be 1. The non-defective ratio means the ratio of non-defective capacitors having no connection deficiencies such as short-circuit to all manufactured capacitors.

As apparent from FIG. 11, the method of Embodiment 2 exhibits a remarkably higher non-defective ratio in the high capacitor ratio range than the conventional method. Accordingly, the capacitor having the high electrostatic capacity can be obtained at a high yield by the method of the Embodiment. Similar trends may be observed in the capacitors obtained by the methods in Embodiments 3 to 7.

Since the above embodiments are described only for examples, the present invention is not limited to the above embodiments, and various modifications or alternations can be easily made therefrom by those skilled in the art without departing from the scope of the present invention.

What is claimed is:

1. A method for manufacturing a semiconductor device having a substrate and a cylindrical member formed thereon, said cylindrical member having an inner wall surface and an outer wall surface and having hemispherical silicon grains that are uniform on said inner wall surface relative to said outer wall surface, said method comprising:

forming a spacer layer made of etchable material on said substrate;

forming a concave in said spacer layer;

forming an amorphous silicon film along said concave to form an amorphous silicon cylindrical member having an inner wall surface and an outer wall surface;

etching said spacer layer to expose said inner wall surface and said outer wall surface of said amorphous silicon cylindrical member;

removing any silicon crystal nuclei that has formed in said outer wall surface as a result of any prior fabrication step by etching away a predetermined thickness of said amorphous silicon cylindrical member containing said silicon crystal nuclei; and, treating said outer and inner wall surfaces of said amorphous silicon cylindrical member to form hemispherical silicon grains thereon, thereby converting said amorphous silicon cylindrical member into a polysilicon cylindrical member having hemispherical silicon grains that are uniform on said inner wall surface relative to said outer wall surface.

2. The method as defined in claim 1, wherein an outer layer of said outer wall surface of said amorphous cylindrical member is removed and said predetermined thickness is between 50 and 80 Å.

3. The method as defined in claim 1, wherein a silicon nitride film is formed before the formation of the spacer layer, and said silicon nitride film is selectively removed by plasma etching employing a first RF output and an outer layer of said outer wall surface of the amorphous silicon cylindrical member is removed by isotropic light etching employing plasma etching using a second RF output lower than said first RF output to remove said silicon crystal nuclei.

4. The method as defined in claim 1, wherein a silicon nitride film is formed before the formation of the spacer layer, and said silicon nitride film is selectively removed by plasma etching and an outer layer of said outer wall surface of said amorphous silicon cylindrical member is removed by plasma etching using an etching gas different from that used for the selective removal of said silicon nitride film.

5. The method as defined in claim 1, wherein a silicon nitride film is formed before the formation of the spacer layer, and said silicon nitride film is selectively removed by plasma etching and an outer layer of said outer wall surface of said amorphous silicon cylindrical member is lightly etched by wet etching.

6. A method for manufacturing a semiconductor device having a substrate and having thereon at least one polysilicon member having an inner wall and an outer wall with hemispherical silicon grains formed uniform on said inner wall relative to said outer wall, said method comprising:

forming on said substrate at least one amorphous silicon member having both an inner wall and an outer wall;

removing from a surface of said outer wall of amorphous silicon member a layer of said amorphous silicon member containing silicon crystal nuclei that have formed previously, thereby removing said silicon crystal nuclei so as to preclude their migrating and causing subsequent non-uniform growth of said hemispherical silicon grains; and subsequently treating said inner wall and said outer wall surfaces of the said amorphous silicon member to convert said amorphous silicon member into a polysilicon member having said uniform hemispherical silicon grains on both said inner wall and said outer wall.

* * * * *